(12) United States Patent
Kugai

(10) Patent No.: US 6,664,903 B2
(45) Date of Patent: Dec. 16, 2003

(54) METHOD, APPARATUS, COMPUTER PROGRAM AND STORAGE MEDIUM FOR DATA COMPRESSION

(75) Inventor: Masami Kugai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/145,802

(22) Filed: May 16, 2002

(65) Prior Publication Data

US 2002/0175840 A1 Nov. 28, 2002

(30) Foreign Application Priority Data

May 28, 2001 (JP) ........................................ 2001-159512

(51) Int. Cl.⁷ ............................................. H03M 7/00
(52) U.S. Cl. ........................................ 341/51; 341/50
(58) Field of Search ..................... 341/50, 51; 375/240; 711/1, 2

(56) References Cited

U.S. PATENT DOCUMENTS

| | | | |
|---|---|---|---|
| 4,054,951 A | 10/1977 | Jackson et al. ............. | 364/900 |
| 4,464,650 A | 8/1984 | Eastman et al. ............ | 340/347 |
| 4,558,302 A | 12/1985 | Welch ........................ | 340/347 |
| 4,701,745 A | 10/1987 | Waterworth ................ | 340/347 |
| 5,049,881 A | 9/1991 | Gibson et al. ................ | 341/95 |
| 5,051,745 A | 9/1991 | Katz ............................ | 341/51 |
| 5,058,144 A * | 10/1991 | Fiala et al. .................. | 375/240 |
| 5,298,895 A * | 3/1994 | Van Maren ................... | 341/51 |
| 5,455,576 A * | 10/1995 | Clark et al. ................... | 341/50 |
| 5,506,580 A * | 4/1996 | Whiting et al. ............... | 341/51 |
| 5,617,552 A * | 4/1997 | Garber et al. ................. | 711/1 |
| 5,699,539 A * | 12/1997 | Garber et al. ................. | 711/2 |
| 5,717,394 A * | 2/1998 | Schwartz et al. ............. | 341/51 |

OTHER PUBLICATIONS

L. Peter Deutsch, "DEFLATE Compressed Data Format Specification Version 1.3," http://www.info-zip.org/pub/infozip/zlib/rfc-deflate.html, Sec. 1.0-9.0 (1996).
Jacob Ziv et al., "Compression of Individual Sequences Via Variable-Rate Coding," IEEE Transactions on Information Theory, vol. 24, No. 5, pp. 530-536 (Sep. 1978).
Jacob Ziv et al., "A Universal Algorithm for Sequential Data Compression," IEEE Transactions on Information Theory, vol. 23, No. 3, pp. 337-343 (May 1977).

* cited by examiner

Primary Examiner—Jean Bruner Jeanglaude
(74) Attorney, Agent, or Firm—Fitzpatrick, Cella, Harper & Scinto

(57) ABSTRACT

A technique for reversible compression of digital data enables lossless data compression at high speed while taking advantage of high-speed decompression. In the technique, a dictionary area is reserved and initialized, the dictionary area being constructed with first and second storage areas. A computer program and storage medium are provided as well.

25 Claims, 18 Drawing Sheets

FIG. 5

```
struct element  {
    unsigned char    c ;
    unsigned char    dummy ;
    unsigned short   offset ;
    struct element   *next ;
} node ;
```

FIG. 8
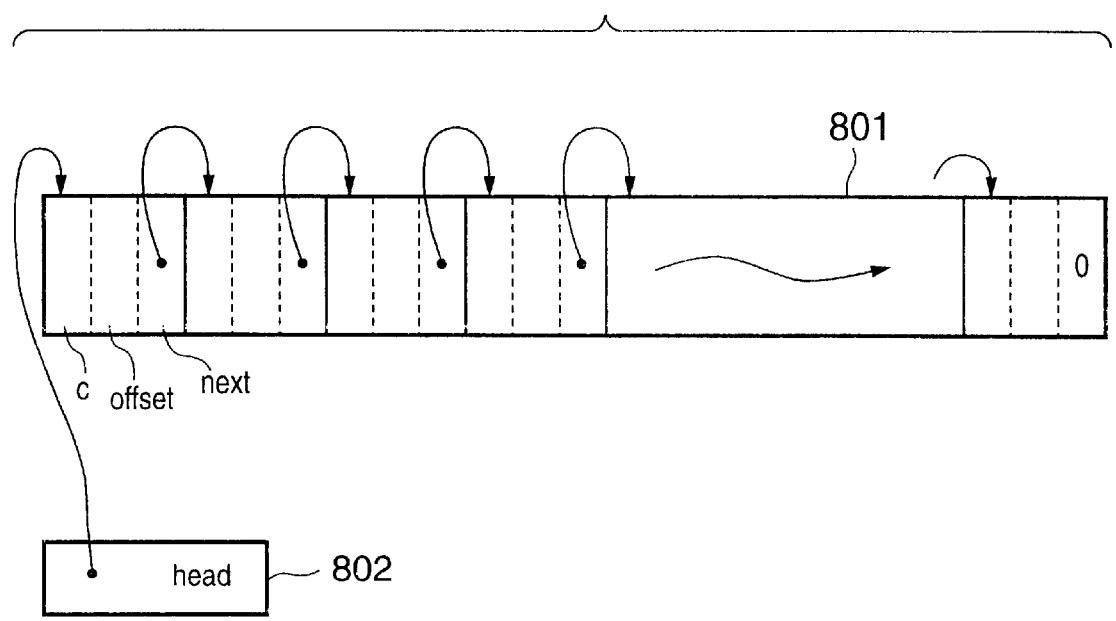
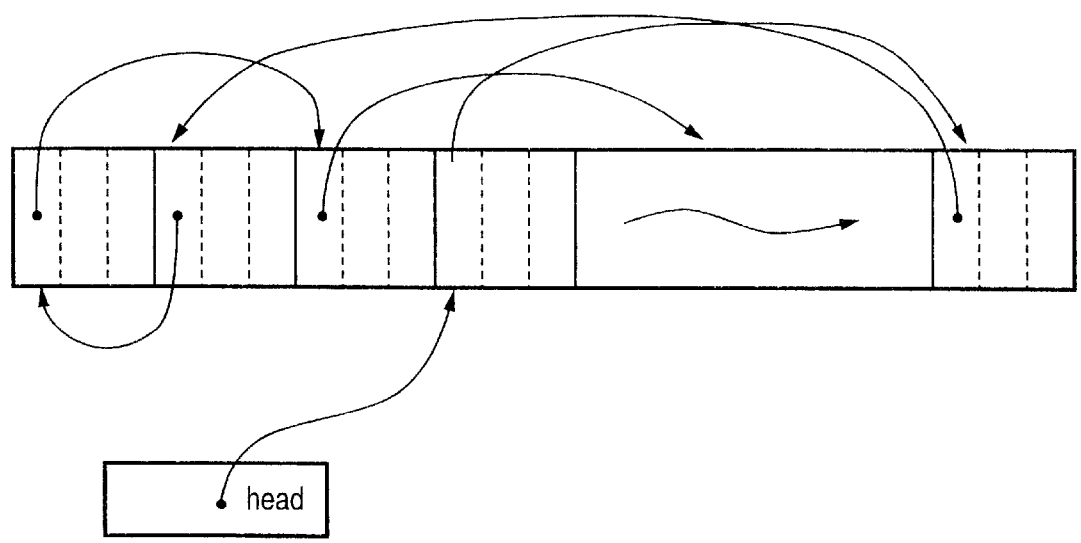

FIG. 9A
```
1  # define MAX_FREELIST   60000
2  # define TABLE_SIZE     (0x0ffff + 1)
3
4  typedef struct element {
5              unsigned char           c ;
6              unsigned char           dummy ;
7              unsigned short          offset ;
8              struct element          *next ;
9  } ELEMENT ;
10
11 ELEMENT    *first_table[TABLE_SIZE] ;
12 ELEMENT    *head_freelist, *root_freelist ;
13 ELEMENT    **last_next ;
14
15 # define GET_FREELIST(p)    { ¥
16      if(head_freelist == NULL) { ¥
17              p = NULL ; ¥
18          } else {            ¥
19              p = head_freelist ; ¥
20              head_freelist = head_freelist->next ; ¥
21              p->next = NULL ; ¥
22          } ¥
23 }
24
25
26 # define RETURN_LIST(p)    { ¥
27      P->next = head_freelist ; ¥
28      head_freelist = p ; ¥
29 }
30
31 #endif
32
33      union two {  /* integer consitituted of the first two charcters */
34
35              unsigned short num;
36              struct c {
37                      unsigned char   first ;
38                      unsigned char   second ;
39              } c ;
40      }       index ;
41
42      unsigned char *p, third ;
43      ELEMENT *ep, *new_node, *prev ;
44
45
46
47
48
49
50
51
52
53
54
55
56
57
58
59
60
```

FIG. 9B

```
61
62
63        str = strstart ;
64        p = &(window[str]) ;
65
66        index. c. first = *p++ ;
67        index. c. second = *p ;
68        str3 = str + 2;
69        ep = first_table[index. num] ;
70        third = window[str3] ;
71
72        /*Insert */
73        if(ep==NULL) {
74                GET_FREELIST(new_node) ;
75                if(!new_node) goto skip_insert ;
76                first_table[index. num] = new_node ;
77                new_node->c = third ;
78                new_node->offset[0] = str ;
79                /* new_node->next was already set to NIL in GET_FREELIST */
80        } else if(ep->c == third) {
81                string_head = ep->offset[0] ;
82                ep->offset[0] = str ;
83        } else if(ep->c > third) {
84                GET_FREELIST(new_node) ;
85                if(!new_node) goto skip_insert ;
86                first_table[index. num] = new_node ;
87                new_node->c = third ;
88                new_node->offset[0] = str ;
89                new_node->next = ep ;
90        } else {
91                prev = ep ;
92                for( ep = prev->next ; ep ! = NULL ; prev=ep, ep =->next)   {
93
94                        if(ep->c == third)   {
95                                string_head = ep->offset[0]
96                                ep->offset[0] = str
97                                break ;
98                        } else if(ep->c > third)   {
99                                GET_FREELIST(new_node) ;
100                               if(!new_node) goto skip_insert ;
101                               prev->next = new_node ;
102                               new_node->offset[0] = str ;
103                               new_node->next = ep ;
104                               new_node->c = third ;
105                               break ;
106                       } else if(ep->next == NULL)   {
107                               GET_FREELIST(new_node) ;
108                               if(!new_node) goto skip_insert ;
109                               ep->next = new_node ;
110                               new_node->offset[0] = str ;
111                               new_node-> c = third ;
112                               /* new_node->next was already set to NIL in GET_F
113 REELIST */
114                               break ;
115                       }
116
117               } /* for-loop */
118       } /*End of if-block */
119
```

```
struct element  {
    unsigned char      c ;
    unsigned char      dummy ;
    unsigned short     offset ;
    struct element     *desc ;
    struct element     *next ;

} node ;
```

```
struct element  {
    unsigned char      c ;
    unsigned char      dummy ;
    unsigned int       code ;
    struct element     *desc ;
    struct element     *next ;

} node ;
```

```
struct element {
    unsigned char      c ;
    unsigned short     offset ;
    struct element     *down ;
    struct element     *next ;
} element ;
```

FIG. 16

| STRING | CORRESPONDING ELEMENT AREA |
|---|---|
| a | 1301, 1302 |
| ab | 1301, 1302, 1305 |
| aba | 1301, 1302, 1305, 1309 |
| abd | 1301, 1302, 1305, 1310 |
| abdp | 1301, 1302, 1305, 1310, 1312 |
| ak | 1301, 1302, 1306 |
| c | 1301, 1303 |
| g | 1301, 1304 |
| gi | 1301, 1304, 1307 |
| gie | 1301, 1304, 1307, 1311 |
| gj | 1301, 1304, 1308 |

METHOD, APPARATUS, COMPUTER PROGRAM AND STORAGE MEDIUM FOR DATA COMPRESSION

FIELD OF THE INVENTION

The present invention relates to a method and apparatus for reversible compression of digital data.

BACKGROUND OF THE INVENTION

For lossless (reversible) data compression methods, there are methods adopting LZ77/LZ78 invented by Ziv and Lempel as basics.

According to LZ77, a window buffer storing previous input data is looked up to find a longest-match string with current input data, and the position and length of the longest-match string found is outputted as coded data, thereby realizing data compression. This method is disclosed in U.S. Pat. No. 4,054,951 (Jackson, et al.) and "A universal algorithm for sequential data compression" by Ziv, J. and Lempel, A., IEEE Transaction on Information Theory, Vol. 23, No. 3, pp. 337–343, May 1977.

Furthermore, according to LZ78, a dictionary generated based on previous input data is looked up to find a longest-match string with current input data, and a code stored in correspondence with the data string found is outputted. Furthermore, a new data string, generated by linking the longest-match string found with the next character, is additionally registered in the dictionary to facilitate a longer match in the next search. This method is disclosed in U.S. Pat. Nos. 4,464,650, 4,558,302, and "Compression of individual sequences via variable-rate coding" by Ziv, J. and Lempel, A., IEEE Transaction on Information Theory, Vol. 24, No. 5, pp. 530–536, May 1978.

A 2–32 KB buffer is appropriate for the window buffer employed in LZ77. Since input data is compared with data stored in the window buffer, the range of the longest-match search is limited to 32 KB of the previous input data at most. On the contrary, in LZ78, the range of search is not limited to the nearest data as in LZ77. The range of the longest-match search in LZ78 can be expanded as far back the previous input data as the size of the dictionary, regardless of the size of the window buffer. Therefore, while LZ77 makes use of a near correlation, LZ78 makes use of a far correlation, thus has versatility.

Moreover, in LZ78, compression is realized by mere comparison between the current input data and dictionary. The construction of the dictionary can be made so as to better be adapted to the data search. Accordingly, the longest-match search can be performed at high speed.

However, in LZ78, data decompression must be performed while generating and updating the dictionary. On the contrary, in LZ77, since the position and offset of the data string in the window buffer are provided as code data, decompression can be performed without generating a dictionary. Therefore, decompression can be performed at higher speed than LZ78.

In other words, LZ78 has versatility with respect to data and is capable of high-speed data compression. LZ77 has poor data versatility, but is capable of high-speed decompression processing.

When compression is performed using LZ77, it is necessary to look up the window buffer storing previous input data to find a longest match with current input data. In order to increase the speed of this processing, there are hash search methods disclosed in U.S. Pat. No. 4,701,745 (J. R. Waterworth), U.S. Pat. No. 5,049,881 (D. K. Gibson), U.S. Pat. No. 5,051,745 (P. W. Katz), and RFC-1951 ("Deflate Compressed Data Format Specification version 1.3" by P. Deutsch). The hash search proposed by these known documents is described below.

FIG. 1 is an explanatory view of the hash search. Reference numeral 10 denotes a window buffer. The area on the left hand of the line P stores already-compressed previous input data before compression. The area on the right hand of the line P stores input data subjected to compression. Assume that the size of the left area of the line P is 32 KB. An offset, indicative of a position in the left area of the line P, increments as it goes toward the left, with the line P as an origin.

Reference numeral 11 denotes a hash array H[i], which stores an offset of the window buffer, and the number of elements is $2^{15}$=32768 entries. The length of the offset is 2 bytes.

FIG. 3 shows steps of compression processing. Description is provided according to this flowchart.

In step 301, an initial value (head address of input data) is given to a pointer C indicative of a current input data string. In step 302, H[i] is initialized to 0. Since an offset being 0 is improbable, this indicates that no data is stored in the offset. In step 303, it is determined whether or not there is more input data to be compressed. If not, the control ends. If yes, the control proceeds to step 304.

Reference numeral 12 in FIG. 1 denotes a character string of current input data. Provided that the first three characters are expressed by an array C[0] to C[2], the hash value h is calculated by the method shown in FIG. 2 (step 304 in FIG. 3).

Note in FIG. 2, the reference letter ^ indicates an exclusive OR. Other reference letters comply with the C language. "x<<y" indicates that x is shifted by y bit in the direction of higher bits. "x&y" indicates to AND x and y in units of bit. After calculating the hash value h, H[h] is compared with 0 in step 305. If H[h] is 0, it indicates that a three-character string having the hash value h has not yet occurred. Then, in step 306, a current offset of the current input data (offset of the first character) is stored in H[h]. Next in step 307, data C[0] having 1 byte is outputted. In step 308, the pointer C is incremented by 1 to enable processing of the next input data, and the control returns to step 303.

If H[h] is not 0 in step 305, it indicates that a three-character string having the same value as the calculated hash value h has occurred in the previous input data. The position m of the H[h] where the character string is located is extracted (step 309). Then in step 310, the current input data is compared with the previous input data located in the position m to obtain a longest-match length L. In step 311, m and L are subjected to Huffman coding, and the coded data is outputted. After obtaining the longest-match length L, the pointer C is incremented by L in step 312, and the control returns to step 303.

In the compression processing of LZ77, the processing speed can be increased by employing the above-described hash search. However, the comparison between the current input data and previous input data is not expanded to the data inputted far back in the past beyond the window buffer, as in LZ78. Therefore, for instance, with regard to data repeated in a cycle of 32 KB that is the size of the window buffer, there is no effect of compression. Meanwhile according to the compression method of LZ78, since generating and updating the dictionary is necessary at the time of decompression, an overhead is generated. Thus, the decompression processing speed is slower than LZ77.

To increase the speed of decompression processing, it is preferable to employ code data, indicative of the offset and length, to extract a corresponding data string from the window buffer at the time of decompression. However, coding the offset and length of the data limits the target of longest-match search to the previous input data stored in the window buffer in compression processing. Therefore, it is difficult to have both ways: increasing decompression speed, and expanding the data search target in compression.

SUMMARY OF THE INVENTION

The present invention has been proposed in view of the conventional problems, and has as its object to provide a data compression method, apparatus, computer program, and storage medium, which can realize lossless data compression at high speed while taking advantage of high-speed decompression.

According to the present invention, the foregoing object is attained by providing a data compression method of reading input data from a predetermined input storage area, searching previous input data that matches the input data, generating coded data based on code generation information corresponding to the previous input data, and outputting the coded data to a predetermined output storage area, comprising the steps of; reserving a dictionary for storing input data related information related to the previous input data, and code generation information of the input data in association with each other, the dictionary comprising an element area which includes link information for linking the element area to another element area; searching the dictionary reserved; registering input data related information, related to the previous input data, and code generation information of the input data in the element area; and tracking the element area according to the link information in the dictionary searching step to search input data related information in the dictionary, which corresponds to the input data related information related to current input data, then obtaining code generation information related to the input data related information, and generating coded data based on the code generation information.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 is a view showing a structure of an element area according to the first embodiment;

FIG. 8 is a view showing a structure of a free element control area;

FIGS. 9A and 9B show source codes of matching and inserting processing;

FIG. 16 is a table showing contents of the dictionary according to the fifth embodiment.

DETAILED DESCRIPTION OF THE PREFERRED EMBODIMENTS

Preferred embodiments of the present invention will now be described in detail in accordance with the accompanying drawings.

<First Embodiment>

Figure 17:
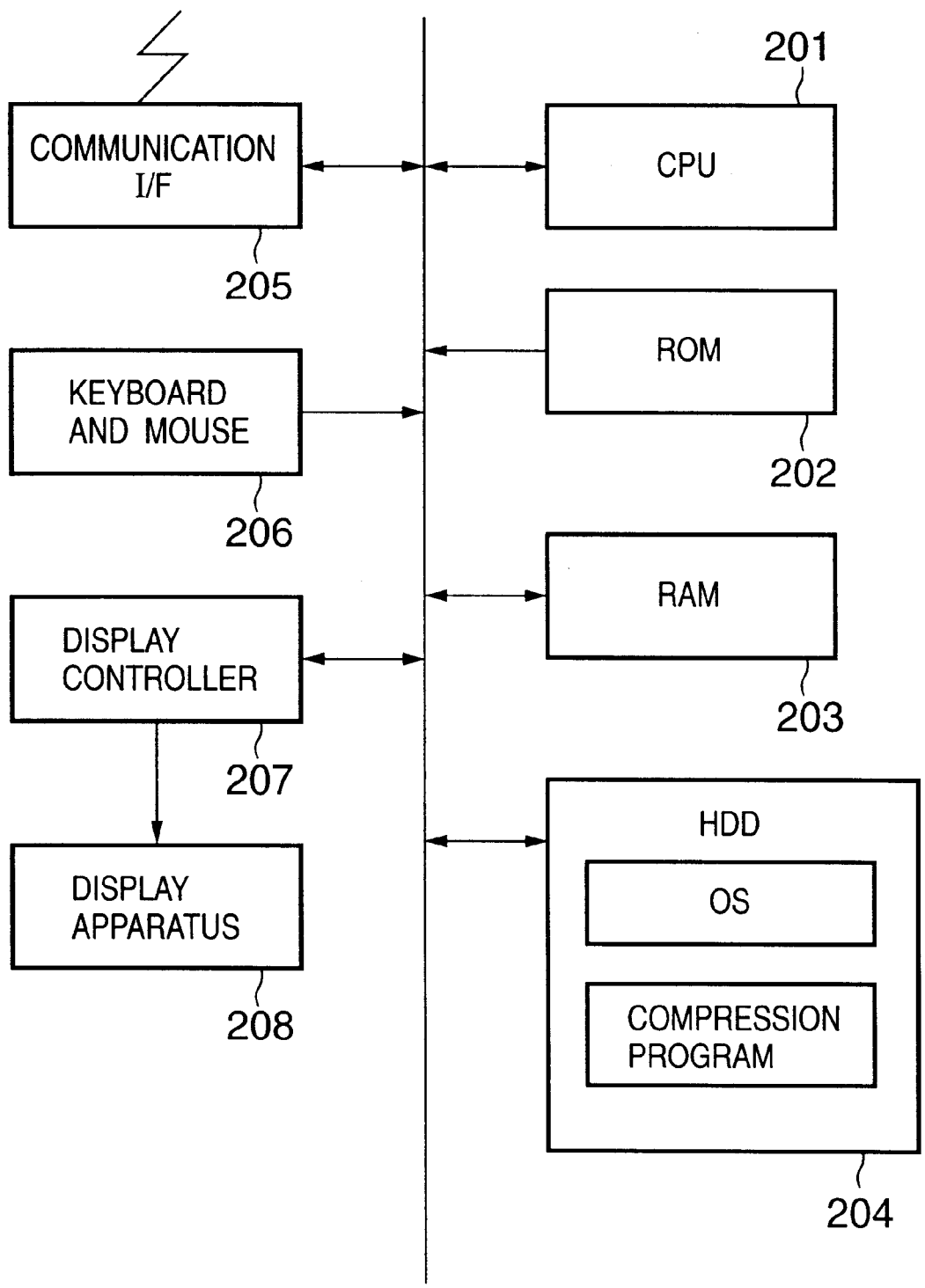
FIG. 17 is a block diagram of an apparatus as an embodiment of the present invention.

FIG. 17 is a block diagram showing an apparatus according to the first embodiment. Referring to FIG. 17, reference numeral 201 denotes a CPU controlling the entire apparatus; 202, ROM storing a boot program, BIOS and so forth; 203, RAM used as a work area of the CPU 201, wherein an OS and compression program according to the embodiment of the present invention are loaded and executed; 204, a hard disk drive (HDD) storing the OS, compression program, and various files such as a file subjected to compression; 205, a communication interface unit, such as a modem or network card, for connecting to a LAN or the Internet; 206, a keyboard and a mouse; 207, a display controller incorporating a memory for displaying and a controller that controls rendering; and 208, a display apparatus such as a CRT or the like.

In the construction of FIG. 17, when the power of the apparatus is turned on, the program stored in the ROM 202 is started, the OS is loaded from the HDD to the RAM 203, and the compression program according to the embodiment is started on the OS. Note that any of the various OS available may be employed.

The description hereinafter is provided, assuming that the OS in the apparatus is operating, a file stored in the HDD 204 subjected to compression is designated, and the compression program is started. Note that the file subjected to compression is not necessarily stored in HDD 204, but may be stored in any storage medium. Furthermore, although the following description assumes that compressed data is outputted to HDD, the compressed data may be outputted to any destination. Moreover, assume that each area in the following description, including variables of an array, is reserved in the RAM 203.

Figure 1:
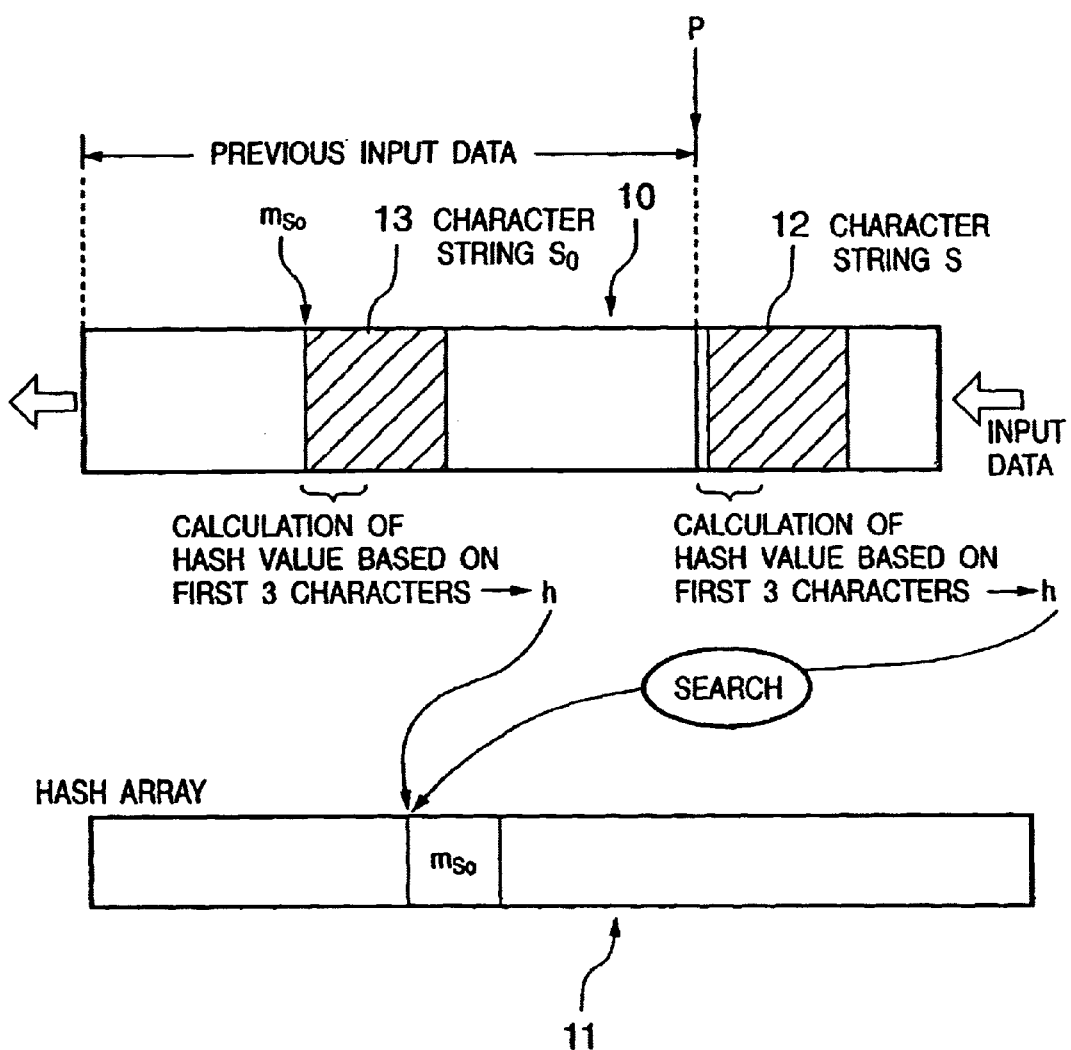
FIG. 1 is an explanatory view of the conventional compression method LZ77.
Figure 2:
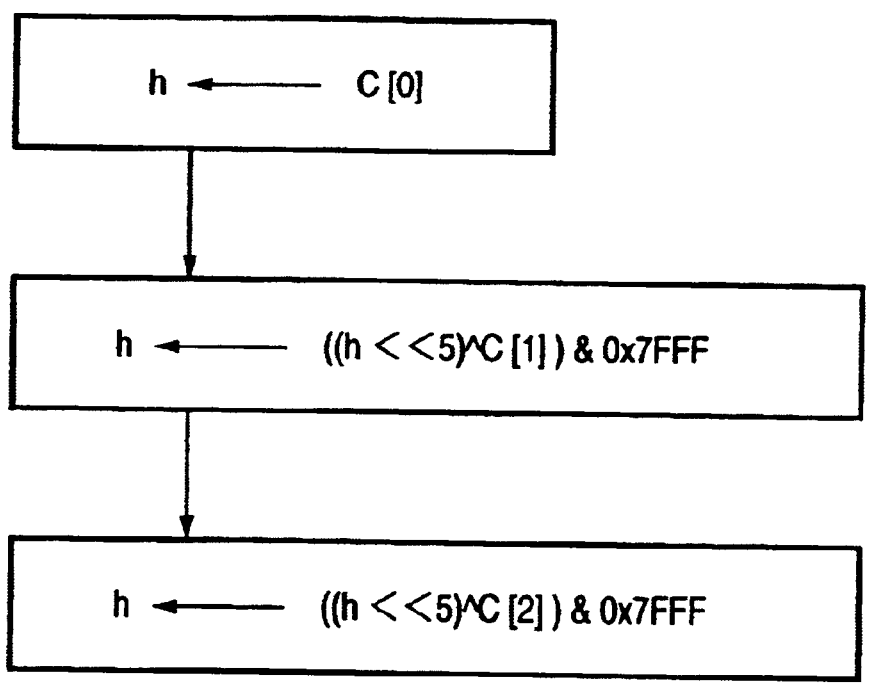
FIG. 2 is a flowchart showing operation steps of a hash function.
Figure 3:
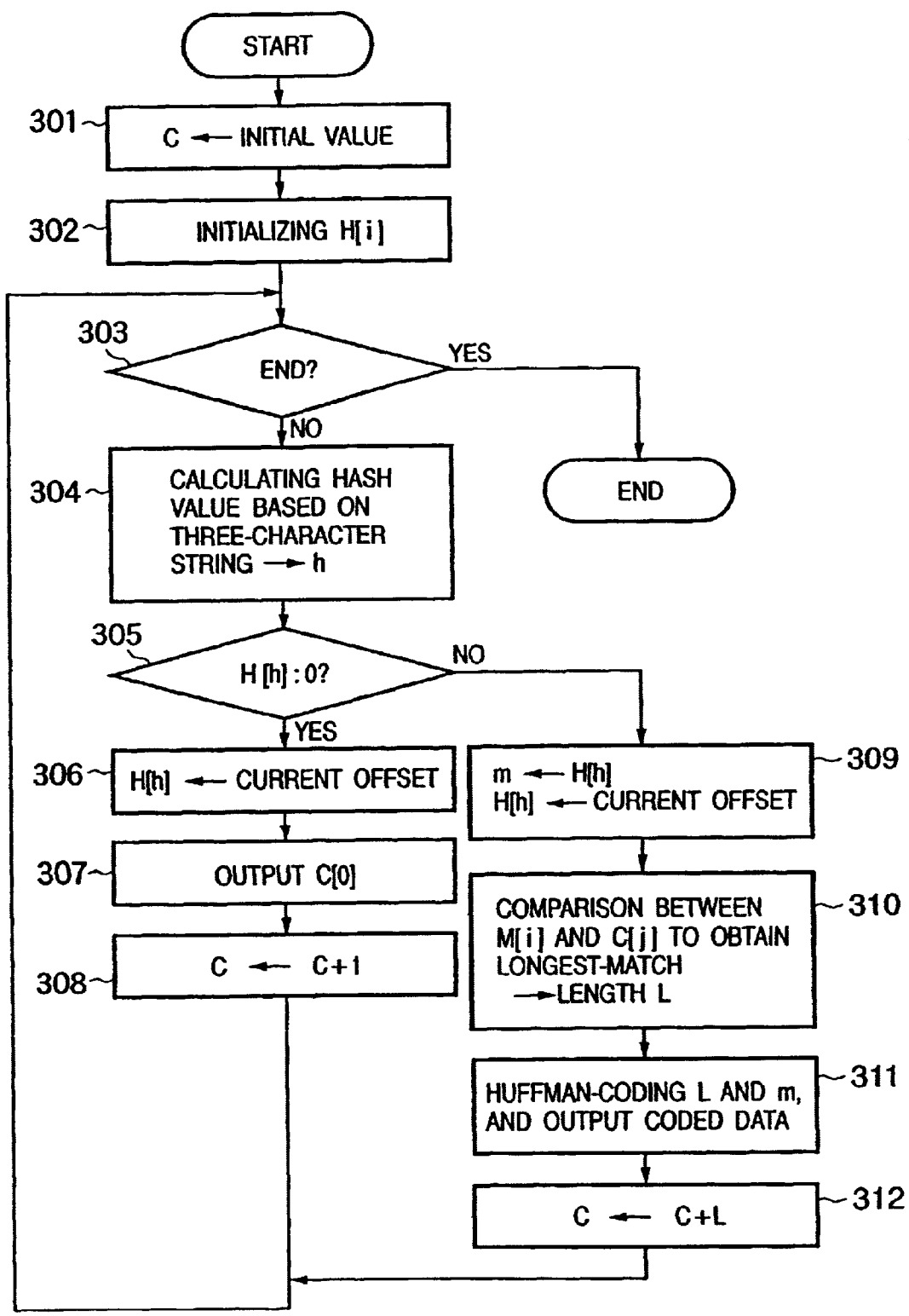
FIG. 3 is a flowchart showing steps of conventional compression processing.
Figure 4:
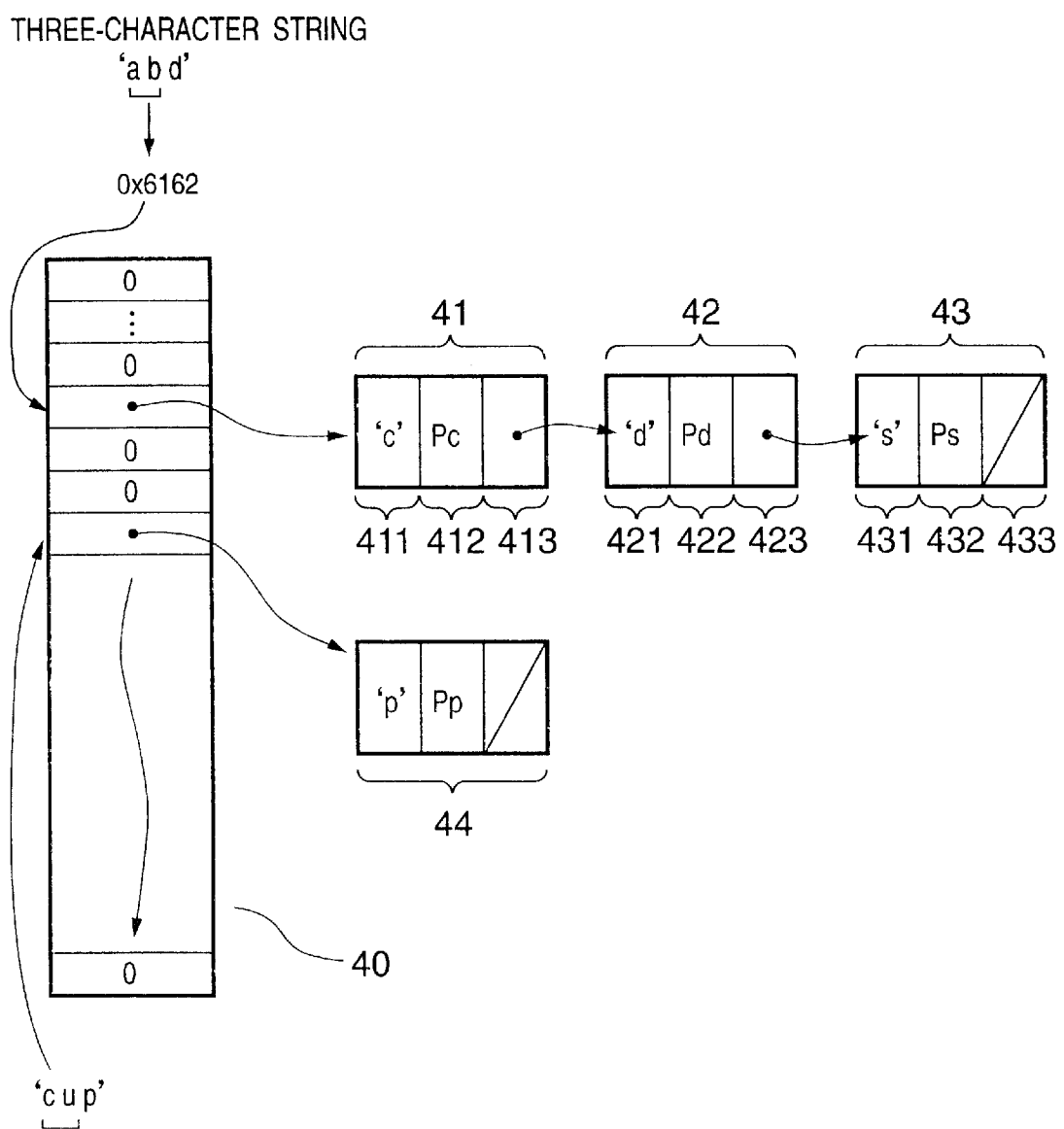
FIG. 4 is a view showing a dictionary structure according to a first embodiment.

FIGS. 4 to 8 are explanatory views of the first embodiment. FIG. 4 shows a dictionary. Reference numeral 40 denotes a header array X[i], equivalent to a first storage area; and 41 to 44, an element area, equivalent to a second storage area. The number of elements in the header array X[i] is $2^{16}$=65,536. Each element (4 bytes) of the array holds an address of the element area. Therefore, the size of the header array is 256 KB (=4×65536).

Each of the element areas 41 to 44 has a data structure written in the C language shown in FIG. 5. A variable C (corresponding to 411) can hold 1 byte of data. An offset (corresponding to 412) can hold an offset of data in the buffer, which serves as data generation information. A next (corresponding to 413) can hold an address of an element area for chain-linking element areas. A dummy is an adjustment variable for making the memory boundary of the data structure to a multiple of 4 bytes.

In the first embodiment, a data string having a length of 3 bytes can be registered in the dictionary shown in FIG. 4. FIG. 4 shows the state in which four three-character strings 'abc', 'abd', 'abs', and 'cup' are registered. The three-character strings correspond to the element areas 41, 42, 43 and 44 respectively. Taking the string 'abc' as an example, the first two bytes 'ab' are expressed by 0×6162 in binary. In the header array [0×6162], the address of 41 is stored. In the element area 41, only the third byte 'c' is stored, since the first two bytes are apparent. The offset 412 holds the position of the same three-character string occurred in the past. The next 413 holds a pointer to the next one of the element areas arranged in ascending order, whose first two bytes are 'ab' as the area 41. Data in 42 is similarly stored. Data in 43 is similarly stored except the next. In order to indicate an end of chain, the next of 43 holds a value improbable for next, NULL (zero) in this case. The next of 44 also holds NULL to indicate an end of chain.

Figure 7A:
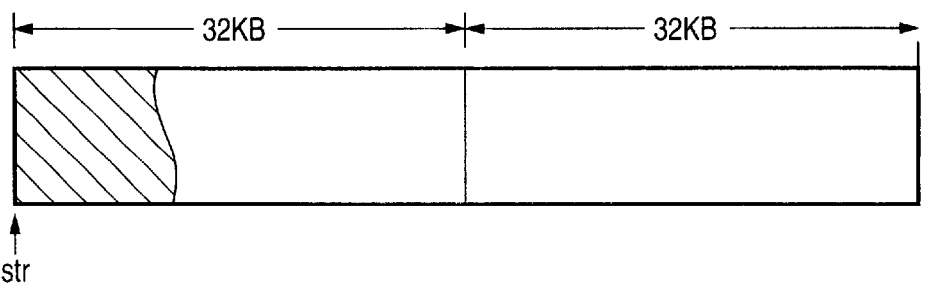
FIGS. 7A to 7E are explanatory views showing a transition of a window buffer.
Figure 7B:
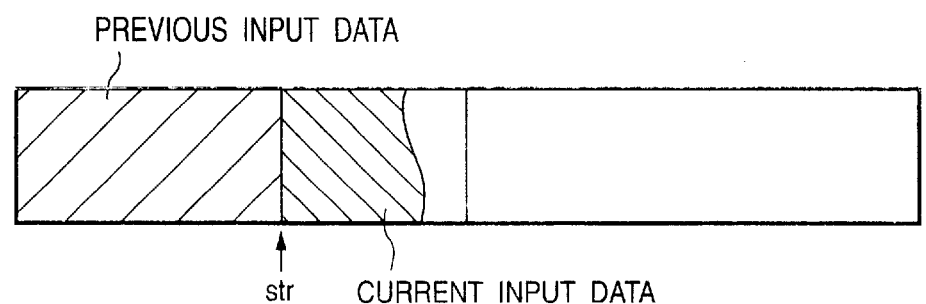
Figure 7C:
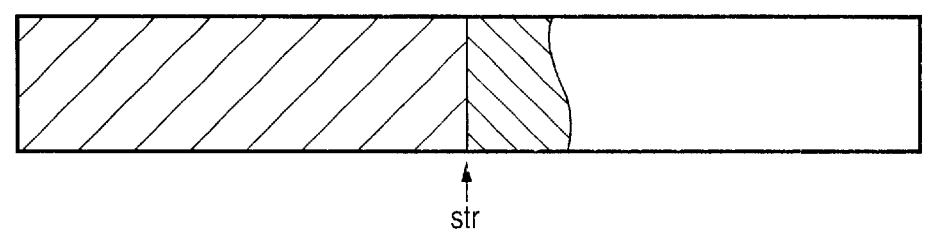
Figure 7D:
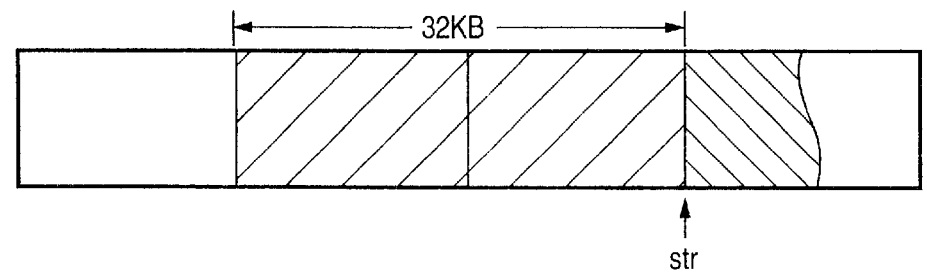
Figure 7E:
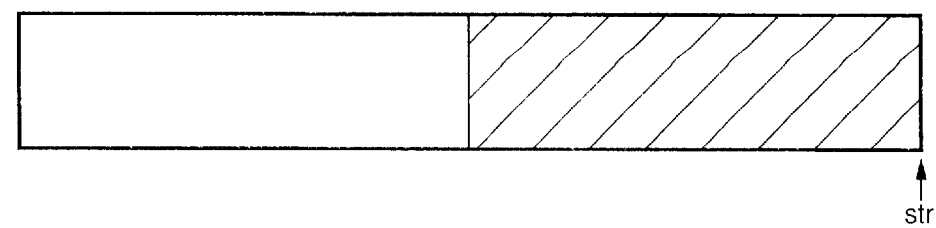

FIGS. 7A to 7E are explanatory views of a window buffer. According to this embodiment, data that finds a longest match with the current input data is searched in the previous input data. The range of search is the most currently inputted 32 KB data. The buffer has a 64 KB area. FIGS. 7A to 7E sequentially show the state of the buffer changing as the compression progresses. FIG. 7A shows a state where no data has been compressed, i.e., there is no previous input data. Therefore, a variable str, indicative of a position of current input data, is 0. FIG. 7B shows a state where compression processing is proceeding, and there are some previous input data stored in the buffer. The variable str holds some value (0<str<32 KB). FIG. 7C shows a state where 32 KB of previous input data are stored in the buffer, thus str=32 KB. FIG. 7D shows a state where compression processing is further proceeding, thus 32 KB<str<64 KB. In this stage, although the previous input data stored in the buffer is larger than 32 KB, data targeted for search is the most currently inputted 32 KB data from the position designated by str. FIG. 7E shows a state where str reaches 64 KB. Since compression processing cannot proceed in the state shown in FIG. 7E, 32 KB of data stored in the buffer is shifted to the left to realize the state shown in FIG. 7C. Thereafter, the states shown in FIGS. 7C to 7E are repeated.

Hereinafter, compression processing according to the first embodiment is described in detail with reference to the flowchart in FIG. 6. In step 601, initialization is performed prior to starting the compression processing. More specifically, the following processing is executed:
NULL is inputted to all elements of the header array X[i];
Free element control area is initialized; and
0 is set to the variable str, indicative of a position of current input data.

The free element control area is explained in FIG. 8. In FIG. 8, reference numeral 801 denotes an element control area; and 802, a free area head pointer. The element control area is expressed by an array W[i], and each element of the array W[i] has a data structure shown in FIG. 5. Assume that the number of elements of the array is an appropriate value FREEMAX (e.g., 60,000). To initialize the free element control area, an address of W[0] is set in the free area head pointer head, and an address of W[i+1] is set in the member variable next of W[i]. This setting is performed with respect to all "i". NULL is set in the variable next of the last variable W[FREEMAX−1]. FIG. 8 illustrates the above processing.

Figure 6:
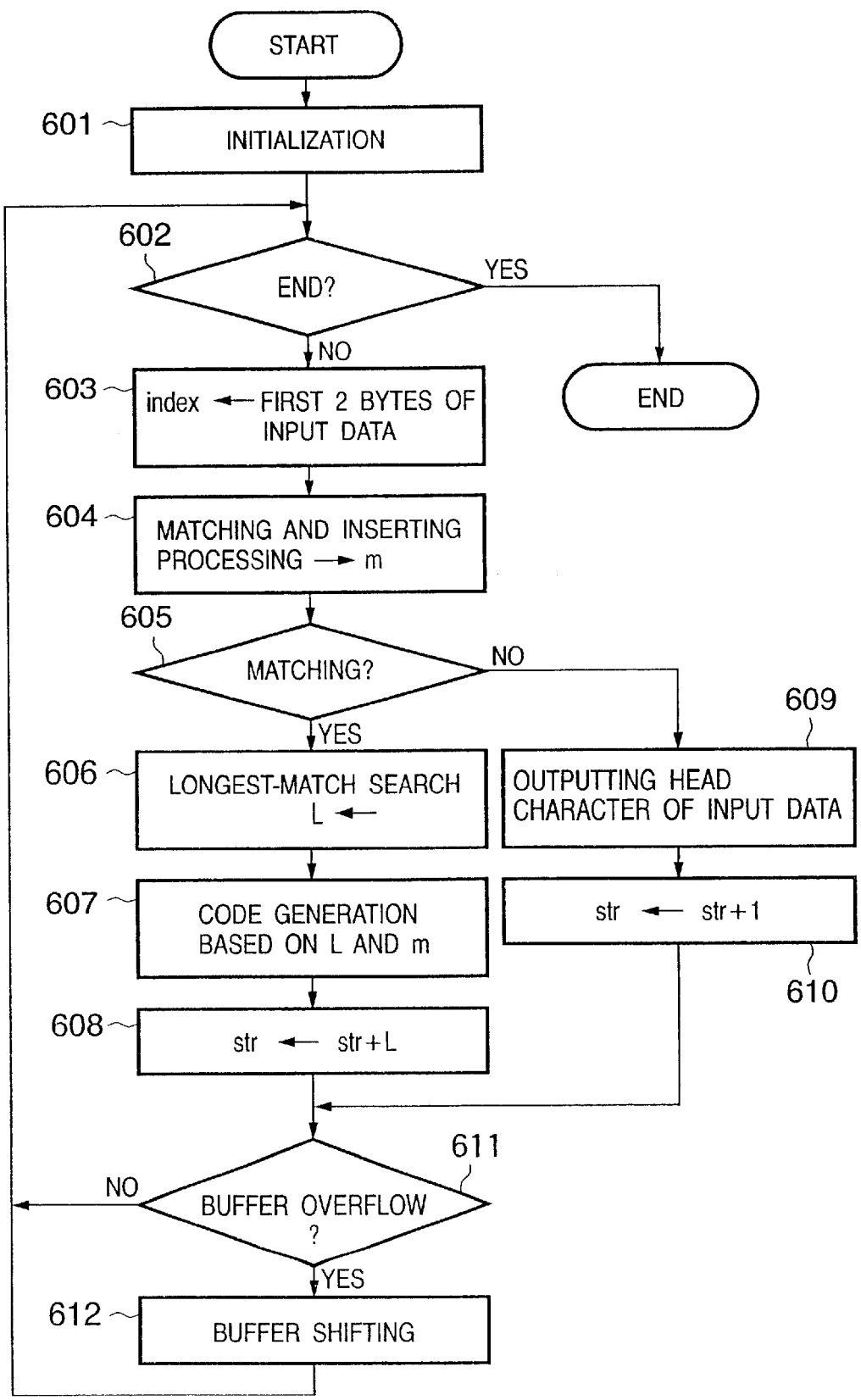
FIG. 6 is a flowchart showing steps of compression processing according to the first embodiment.

Next in step 602 in FIG. 6, it is determined whether or not there is input data to be compressed. If NO, the control ends, while if YES, the control proceeds to step 603.

Hereinafter, the window buffer shown in FIG. 7 is expressed by Window[i]. Each element of the array Window [i] has 1 byte. A variable index is a 2-byte variable, to which 2 bytes consisting of Window[str] and Window[str+1] are set. The index is equivalent to representative data of input data. 0 is set in the variable m.

Next in step 604, the same data as the three-character string (input data related information), consisting of Window[str], Window[str+1], and Window[str+2], is searched in the dictionary. If the same data is not found in the dictionary, this three-character string is registered in the dictionary (40, 41). If the first two characters (representative data) of the three-character string find a match in the header array 40 (if X[index]≠0), the remaining one character (auxiliary data) is registered in the element area 41. If the first two characters do not find a match (if X[index]=0), the address of the element area 41 is registered in a corresponding position of the header array 40 designated by the first two characters. FIGS. 9A and 9B show an example of a program written in C language to realize the processing in step 604. Window[str+2] corresponds to the auxiliary data of the input data.

Assuming that the three-character string is 'abd' and the dictionary has a state shown in FIG. 4, an index thereof is 0×6162 (binary number corresponding to 'ab'). X[index] is referred, and a value other than 0 is found. This value, used as a pointer, leads to the area 41. In the area 41, 'c' in 411 is compared with the third byte of 'abd' that is auxiliary data. Since a match is not found, the pointer of 413 is tracked to the area 42. In the area 42, 'd' in 421 is compared with the third byte of 'abd', and a match is found. In other words, the same three-character string as the current input data is found. Since the value 'Pd' in 422 indicates a position of the previously inputted three-character string stored in the buffer, 'Pd' is set in m, and an address of the current pointer str is stored in the area of 'Pd'.

Assuming a case where the three-character string is 'abe', a match is not found even if the data is tracked to the area 43. The search ends up finding that 's' in 431 has a larger binary value than 'e' (third byte of 'abe'). Since the areas 41 to 43 are chain-linked increasingly in order of binary values of the first character, even if there is an element area further linked to the area 43, it is apparent that a match to the three-character string will not be found. Thus, the search is terminated. Then, a new element area where the variable c is 'e' is inserted between the areas 42 and 43. For this insertion, an unused area is acquired from the free element control area. Besides this, there are cases where a new element area is added to the top of a chain or to the end of a chain. Appropriate processing method thereof is described in FIGS. 9A and 9B. In other words, addresses of the pointers are updated to arrange the chains increasingly in order of occurring character codes.

Note that a position in the buffer is expressed by a value equal to or larger than 1, with 1 being an origin. If m=0, it indicates that a match is not found for the three-character string.

Next in step 605, it is determined whether or not a match has successfully been found in the dictionary (the same three-character string is found, i.e., m≠0).

If m≠0, then in step 606, comparison is performed between data stored in m+3 in the buffer and the fourth byte of the input data, to obtain a longest-match length L by a linear search.

Hereinafter, description is provided on an advantage of this embodiment, which is superior to the hash search proposed by U.S. Pat. No. 4,701,745 and so on.

In the known hash search, a hash array holds a hash value and a buffer position of a three-character string in association with each other. A hash value is obtained by a hash function based on three characters of inputted data, and a buffer position m which is stored in a hash array of the same hash value is obtained. In this case, hash values obtained from different three-character strings may have the same value. For this reason, to obtain a longest-match length, it is wrong to start the search from the position m+3. Instead, the search must be started from the position m, i.e., the first character of the input data must be compared with data stored in the position m of the buffer. On the contrary, according to the present invention, since the number of comparison is smaller, the present invention is more advantageous.

Referring back to step 607 in FIG. 6, coded data is generated and outputted. Generation of coded data is realized by sequentially outputting m and (L−1), wherein m is expressed by a 16-bit binary value, the most significant bit of which is always 1, and (L−1) is expressed by a 8-bit binary value. Note that since L can express only up to 256 bytes, the longest-match search in step 606 is terminated at 256 bytes. When 1 byte is outputted in an uncompressed form, bit "0" is prefixed to the uncompressed 1 byte and outputted.

As another method of coding, L and m may be Huffman-coded before output, as disclosed by Deutsch, L. P., "DEFLATE Compressed Data Format Specification," RFC-1951. Huffman coding is a form of variable-length coding. Other variable-length coding may be employed.

Next in step 608, str+L is set in the variable str, indicative of a position of the current input data, thereby updating the variable.

If the matching is unsuccessful in step 605, then in step 609, 1 byte of Window[str] is outputted as a 9-bit data having bit "0" in the head, or Huffman-coded and outputted as described in the aforementioned RFC-1951.

Next in step 610, str+1 is set in str to update the variable str, and the control proceeds to step 611.

After updating the variable str, the buffer may overflow as the state shown in FIG. 7E. If the buffer does not overflow, the control returns to step 602 to repeat the processing 602 to 608. If the buffer overflows, 32 KB of data is shifted to the left in the buffer as mentioned above, changing the state of buffer from FIG. 7E to FIG. 7C. In this stage, all the offset of the areas 412, 422, 432, . . . , stored in the element area of the dictionary, must be reduced by 32 KB (32, 768). As a result of reduction, if the offset becomes equal to or lower than 0, the corresponding element area is removed from the dictionary and returned to the free element control area. This operation is realized by changing a value of the variable next and rewriting the variable head in FIG. 8, as shown in the macro-function RETURN_LIST of the source code in FIG. 9A. This is a normal list processing technique.

As a result of acquiring an unused element area from the free element control area or returning an unnecessary element area to the free element control area, the free element control area no longer keeps the initial state shown in the upper drawing of FIG. 8, but will have complicated links as shown in the lower drawing of FIG. 8. It is easily understood that the element areas used are not the consecutive free element control areas initially prepared.

It should be understood from the above description that the storage areas of the dictionary according to the present invention differ from consecutive storage areas as in a hash array. After completion of buffer shifting in step 612, the control returns to step 602 to repeat the processing.

<Second Embodiment>

Figure 10:
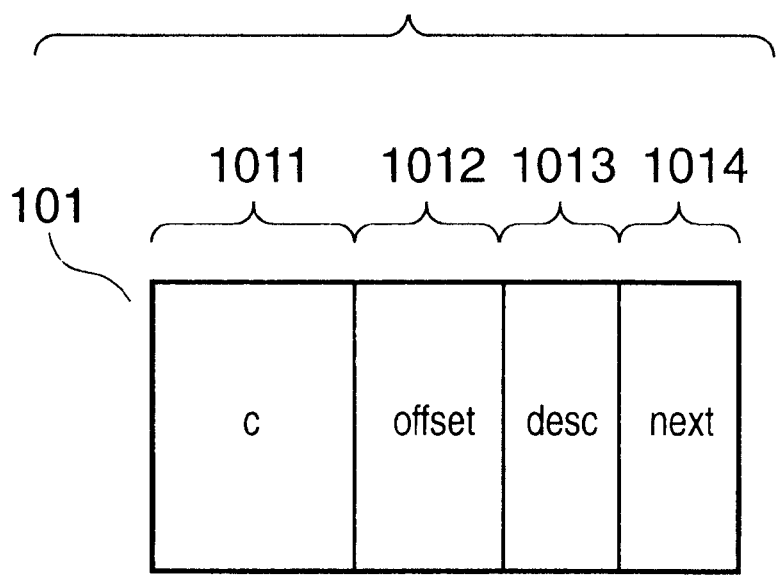
FIG. 10 is a view showing an element area and structure thereof according to a second embodiment.

Next, operation according to the second embodiment is described with reference to FIGS. 10 and 11. FIG. 10 is an explanatory view of an element area. Reference numeral 101 denotes an element area; 1011, auxiliary data; 1012, an offset serving as code generation information; 1013, a pointer to a child element area; and 1014, a pointer to the next element area.

Figure 11:
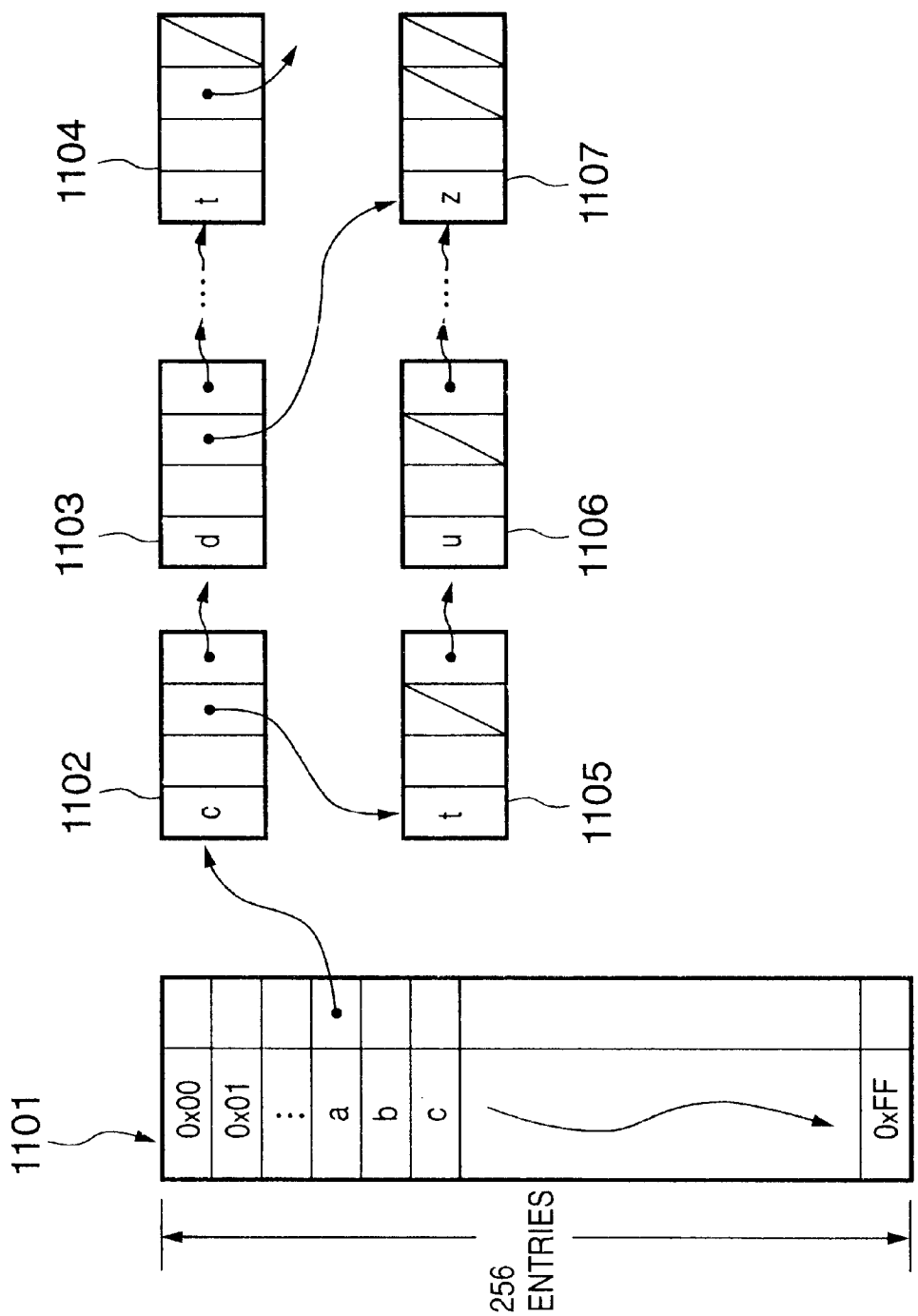
FIG. 11 is a view showing a dictionary structure according to the second embodiment.

FIG. 11 is a view explaining a structure of a dictionary. Reference numeral 1101 denotes an array consisting of 256 elements, which corresponds to the above-described storage area of the first embodiment. In each element of the array, a pointer of an element area is stored. In other words, the pointer is equivalent to classification data. The entire element area that can be tracked from each element of a header array corresponds to the second storage area. The element areas 1102 to 1104 in FIG. 11 are areas corresponding to the second character of a three-character string, and element areas 1105 to 1107 are areas corresponding to the third character of the three-character string.

According to the second embodiment, an index of the header array corresponds to the first character of the three-character string (input data related information). This index is equivalent to representative data of the input data. The second and third characters of the three-character string correspond to auxiliary data. Note since one character (1 byte) is used as an index of a header array, entries of the header array are 256.

The processing flow of the second embodiment is mostly the same as that shown in FIG. 6 of the first embodiment. However, steps 603 and 604 are changed, as the dictionary structure is different from that of the first embodiment.

For instance, in the state of dictionary shown in FIG. 11, assume that a three-character string 'acz' is searched. A binary value of 'a', which is the representative data, is set in the index and the header array X[index] is searched. The address of the header array X[index] leads to 1102. The content of the variable c is compared with the auxiliary data 'c'. Since a match is found, a variable desc of 1102 is extracted. The address designated by desc leads to 1105. The content of the variable c is compared with auxiliary data 'z'. Then, chains of the element areas are tracked using the pointer next until a match is found in 1107. The offset of 1107 is extracted and set in m. If a matching element area is not found as a result of the above search, m holds 0. Note in FIG. 11, areas 1102 to 1104 and areas 1105 to 1107 are respectively linked in ascending order of the variable c (or updating processing is performed so as to realize such link). Other processing are the same as that described in the first embodiment.

In the second embodiment, the header array X[i] is constructed such that the head byte of a three-character string serves as an index. However, with the use of an appropriate hash function h(x) that calculates a hash value from a three-character string x, X[h(x)] may be used in place of the aforementioned header array. In this case, an index of the array X[h(x)] has 2 bytes. In this manner, since a three-character string can be registered with dispersion by the header array, the search speed of tracking element areas improves. The hash function is provided, for instance, as follows:

$$h(x)=(S[0]<<8)|(S[1]\^{}S[2]);$$

(<<represents bit shifting, and ^ represents an exclusive OR)

S[i] represents the (i-th+1) byte data of a three-character string.

In this case, the aforementioned hash value is representative data.

Since the hash function h(x) varies depending on the first byte of data, an element of a header array similar to that of FIG. 11 expresses the first byte, and two element areas linked from the element of the header array express the second and third bytes respectively.

<Third Embodiment>

By virtue of the above-described second embodiment, the following processing becomes possible. More specifically, not only a three-character string but also a string of arbitrary length can be registered in the dictionary shown in FIG. 11. For instance, if a four-character string is to be registered in the dictionary, an address of an element area corresponding to the fourth character is set in each variable desc of the areas 1105 to 1107, thereby linking the element areas of the fourth character.

In this case, input data related information is a head byte array of input data, having an indefinite length. The first 1 byte of the input data is the representative data, and a byte array of the second and following bytes, having an indefinite length, is the auxiliary data.

It is easily understood that, also in the first embodiment, a string of arbitrary length can be registered in the dictionary by replacing the structure of an element area shown in FIG. 5 with the structure shown in FIG. 10.

In step 606 in FIG. 6, when a longest-match data string is found as a result of comparison between the input data and data stored in the buffer, the string having a longest-match length is registered in the dictionary.

If the registration processing of a longest-match string in the dictionary is added to step 606, in the next search, a longest match can be found without linear search in the buffer, but with mere comparison between the input data and dictionary. Therefore, an increased processing speed can be expected.

Moreover, in step 612 where data shifting is performed, if an unnecessary element area is not removed from the dictionary, the strings that have been inputted far back in the past and no longer stored in the buffer can be kept in the dictionary. As a result, a longest match can be found when performing matching in the dictionary. Therefore, data compression can be performed efficiently.

<Fourth Embodiment>

Figure 12:
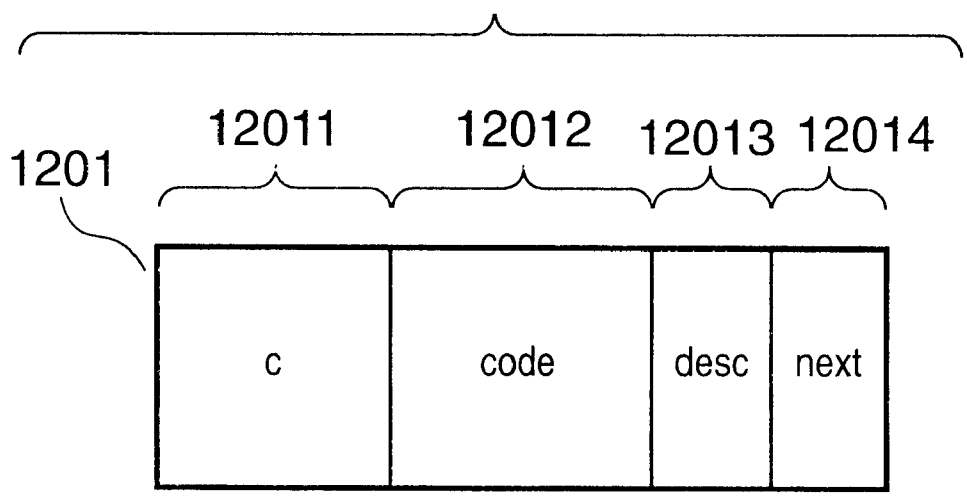
FIG. 12 is a view showing an element area and structure thereof according to a fourth embodiment.

In the first embodiment, the longest-match length L and previous data location m are expressed in a 23-bit code. In the fourth embodiment, an element area shown in FIG. 12 is used in place of the element area shown in FIG. 10. In FIG. 12, a variable code is stored in place of the variable offset.

The variable code indicates coded data of a string, which is generated by tracking element areas from the header array and linking each variable c. The offset expressed in 16 bits whose first bit is always 1, and a length of the string expressed in 8 bits, i.e., the total of 24 bits, are set in the variable code.

<Fifth Embodiment>

Figure 13:
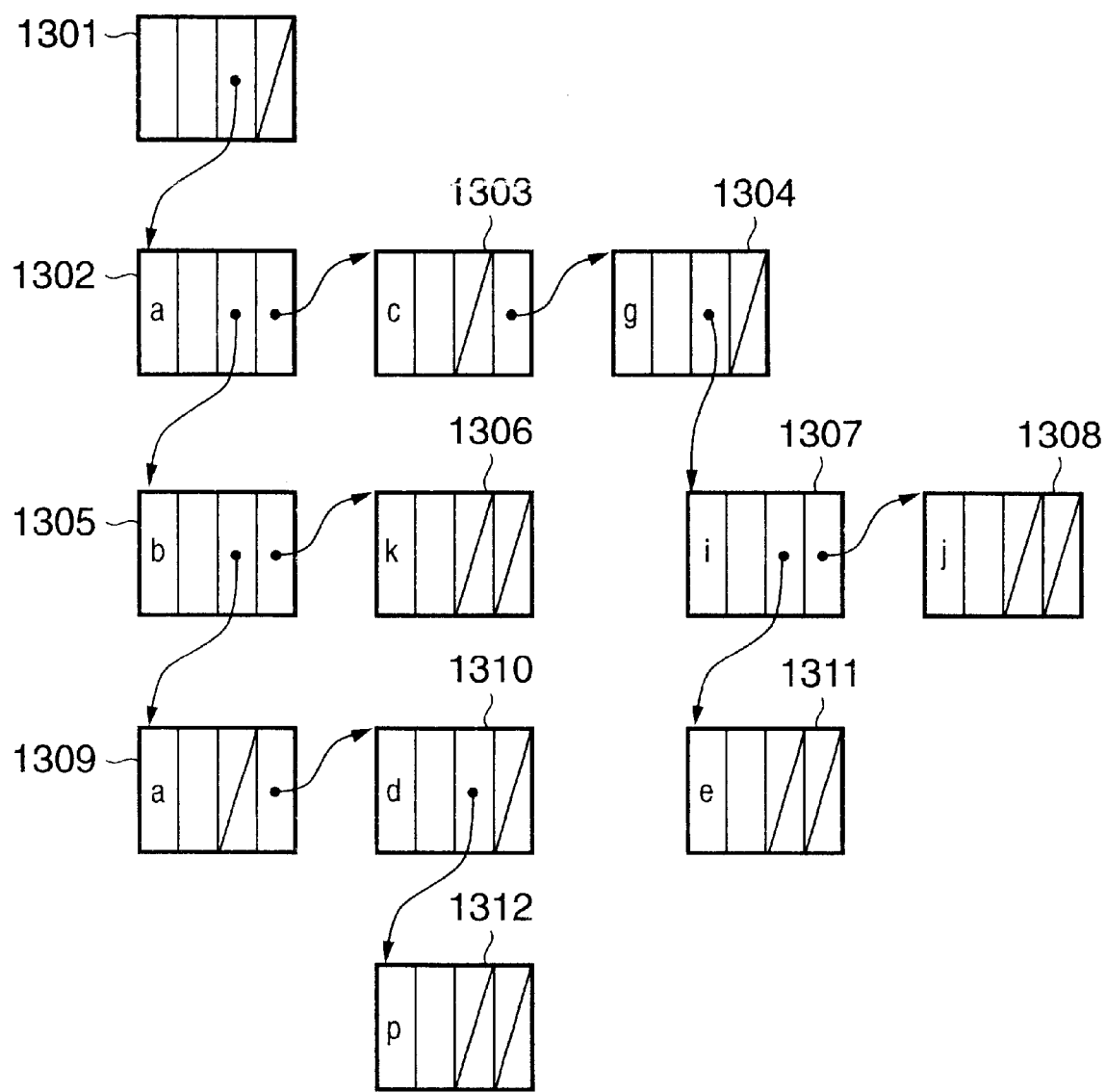
FIG. 13 is a view showing a dictionary structure according to a fifth embodiment.

The fifth embodiment is described with reference to FIGS. 13 to 16. FIG. 13 is a view explaining a data structure of a dictionary according to the fifth embodiment, wherein reference numerals 1301 to 1312 denote element areas. Each element area has a data format shown in FIG. 14. Reference numeral 1402 denotes a variable c holding 1 byte of data; 1403, a variable offset holding a position of the head byte of a string; 1404, a variable down holding a pointer to a child element area; and 1405, a variable next holding a pointer to the next element area.

In FIG. 13, reference numeral 1301 denotes an element area of a root, which is a search start point in the dictionary. An address of 1301 is stored in a variable root. Reference numerals 1302 to 1304 denote element areas storing the head byte of strings already registered in the dictionary. The area 1302 stores strings whose head byte is 'a', 1303 stores strings whose head byte is 'c', and 1304 stores strings whose head byte is 'g'. The area 1302, having a pointer to a child element area stored in the variable down, is linked to the areas 1305 and 1306. Reference numerals 1305 to 1308 denote element areas storing the second byte of strings. The area 1305 stores strings whose second byte is 'b', and 1306 stores strings whose second byte is 'k'. The area 1305, having a pointer to a child element area stored in the variable down, is linked to the areas 1309 and 1310. Reference numerals 1309 to 1311 denote element areas storing the third byte of strings. The area 1310, having a pointer to a child element area stored in the variable down, is linked to the area 1312. Since the variables down and next of the area 1312 hold NULL, the area 1312 is not linked to anywhere.

As shown in FIG. 16, there are eleven strings registered in the dictionary having a state shown in FIG. 13. Element areas corresponding to each string are shown in FIG. 16. For instance, string 'abdp' consists of five element areas, including the roots of 1301, 1302, 1305, 1310, and 1312.

Figure 15:
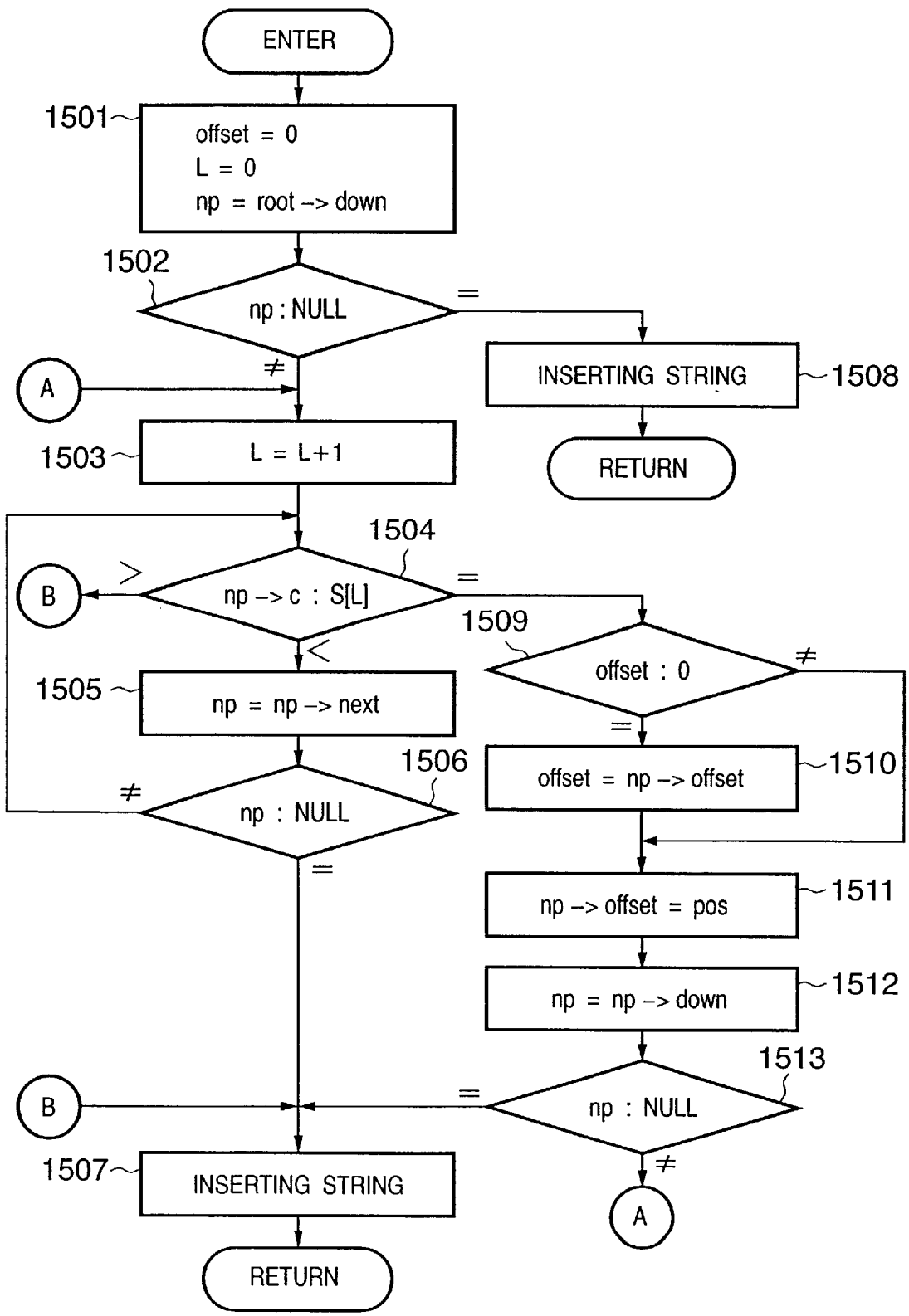
FIG. 15 is a flowchart showing steps of compression processing according to the fifth embodiment.

Data compression processing according to the fifth embodiment using the foregoing dictionary is mostly the same as that shown in FIG. 6, except that matching and inserting processing in step 604 is replaced with the flowchart in FIG. 15. Hereinafter, description is provided with reference to FIG. 15.

Note hereinafter, the variable offset holds a position of a string in the buffer, which finds a longest match in the dictionary with the input data. 'L' indicates a length of the string. A variable np holds a pointer of an element area for searching a tree in the dictionary. A variable pos holds in advance a position of input data. S[i] indicates an array representing a string of inputted data.

In step 1501 in FIG. 15, variables offset and L are initialized to 0. In the variable np, a variable down of a root element area is set. In step 1502, it is determined whether or not the variable np is 0. If so, there are no strings registered in the dictionary. Thus, the control proceeds to step 1508 to register a three-byte string from the position pos of inputted data to the dictionary in the manner shown in FIG. 13. If the variable np is not 0, the control proceeds to step 1503 to increment the length L by 1. In step 1504, the L-th byte S[L] of the inputted data string is compared with a variable np→c of the element area designated by np. If the variable np→c is smaller than S[L], a pointer to the next element area is set in np in step 1505. In step 1506, it is determined whether or not np is NULL. If so, there are no strings in the dictionary that find a further match. Therefore, the control proceeds to step 1507 where the inputted data string is added to the element area designated by np. If np is not NULL in step 1506, the control returns to step 1504 because there is an element area to be compared. If the variable np→c is larger than S[L] in step 1504, it is no longer necessary to track the lateral chain as the tree in FIG. 13 is registered in order of the dictionary. The inputted data is inserted before the element area designated by np.

If the variable np→c is equal to S[L] in step 1504, the control proceeds to step 1509. If the variable offset is still 0, the offset of np is set, but if the variable offset is not 0, setting is not performed. In step 1511, pos of the input data is set in the offset of np to update. In step 1512, the pointer down to a child element area is set in the variable np. In step 1513, it is determined whether or not np is NULL. If so, the control proceeds to step 1507 to insert the input data string in a position designated by np, thereby registering the data in the dictionary. If np is not 0 in step 1513, the control returns to step 1503.

In the foregoing processing of registering the inputted data string in the dictionary (steps 1508 and 1507), if the length L is equal to or smaller than 2, strings S[L] to S[2] having (3−L) bytes are registered, while if the length L is equal to or larger than 3, a string S[L] having 1 byte is registered. When registering a data string in the dictionary, the byte of inputted data string is set in the variable c of the element area, and a head position of the inputted data string, i.e., pos, is set in the variable offset. In the variables down and offset, pointers are set so as to realize the form of dictionary shown in FIG. 13.

It should be noted that, as a result of data string registration in the dictionary, the dictionary shown in FIG. 13 is constructed such that element areas are arranged in ascending order of the variable c.

Note that offset corresponds to m in FIG. 6. In step 606, a longest match is further searched in the window buffer. In step 606, the pos+m+1 and subsequent data of the input data are compared with m+1 and subsequent data in the window buffer. Herein, if a longest match having a length L2 (L2>L) is found, a string S[0] to S[L2−1] is registered in the dictionary to facilitate the next matching processing. Since the string S[0] to S[L−1] has already been registered, the remaining S[L] to S[L2] is additionally registered.

Figure 14:
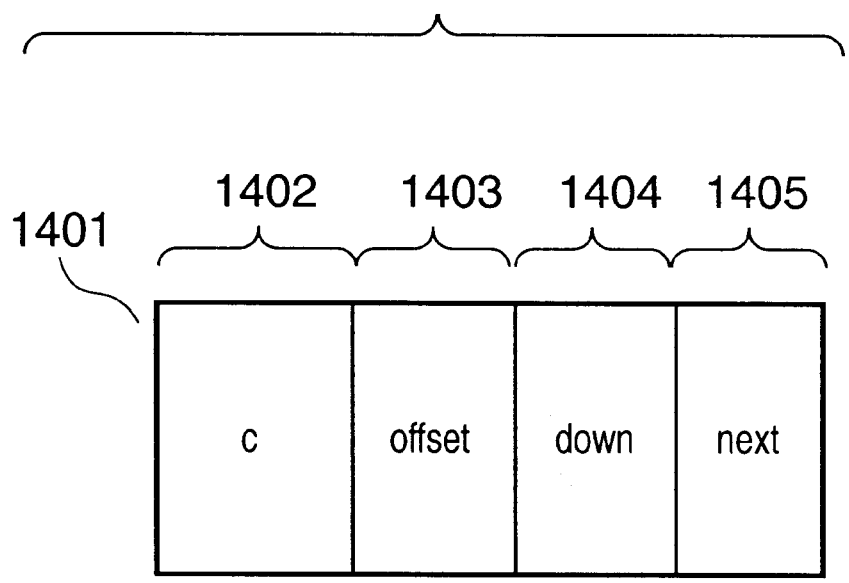
FIG. 14 is a view showing an element area and structure thereof according to the fifth embodiment.

In the above description, the variable c of the area 1402 in FIG. 14 corresponds to input data related information. There is no data that corresponds to representative data and auxiliary data in the fifth embodiment. Furthermore, the following improvement may be added to the fifth embodiment.

First, as similar to the first embodiment, a free element control area, element acquisition means, element returning means, and dictionary updating means are provided to realize dictionary updating, acquisition and returning of an element area and memory control of element areas.

As similar to the first embodiment, only a predetermined length of input data, i.e., a three-byte string, may be registered in the dictionary. Furthermore, as similar to the fourth embodiment, coded data may be stored instead of the variable offset.

Note that each of the above-described embodiments requires hardware such as RAM 203 or the like, but in reality, is realized by a program loaded to the RAM 203 and executed by the CPU 201. In other words, the present invention can be realized by a program executed by a computer. Naturally, the program constitutes the present invention. Furthermore, normally a program stored in a storage medium is executed by directly reading the program out of the storage medium, or by installing or copying the program to a storage device (HDD 204 or the like) of a computer. Therefore, such storage medium also constitutes the present invention. The storage medium may employ any type of recording method; examples are: a paper storage medium such as a paper tape or the like, a magnetic storage medium such as a floppy disk, an optical storage medium such as CD-ROM or the like, and a magneto-optical storage medium such as MO or the like.

As has been described above, according to the present invention, it is possible to perform lossless data compression at high speed while taking advantage of high-speed decompression. Furthermore, since the present invention takes advantage of the high-speed decompression of LZ77 while adopting the dictionary construction according to LZ78 which allows a wide range of search, the present invention can be applied to a data compression apparatus employing LZ77 or to a compression apparatus employing LZ78 without changing the algorithm.

The present invention is not limited to the above embodiments and various changes and modifications can be made within the spirit and scope of the present invention. Therefore, to apprise the public of the scope of the present invention, the following claims are made.

What is claimed is:

1. A data compression method of reading input data from a predetermined input storage area, searching previous input data that matches the input data, generating coded data based on code generation information corresponding to the previous input data, and outputting the coded data to a predetermined output storage area, comprising the steps of:

reserving a dictionary for storing input data related information related to the previous input data, and code generation information of the input data in association with each other, said dictionary comprising an element area which includes link information for linking the element area to another element area;

searching the dictionary reserved;

registering input data related information, related to the previous input data, and code generation information of the input data in the element area; and tracking the element area according to the link information in said dictionary searching step to search input data related information in the dictionary, which corresponds to the input data related information related to current input data, then obtaining code generation information related to the input data related information, and generating coded data based on the code generation information.

2. The data compression method according to claim 1, further comprising the step of registering in the dictionary the input data related information and code generation information corresponding to the input data in association with each other, in a case where the input data related information in the dictionary, which corresponds to the input data related information related to current input data is not found in said searching step.

3. The data compression method according to claim 1, further comprising the steps of:

reserving a free element control area including an unused element area;

acquiring an element area;

returning an element area; and updating the dictionary, wherein in said dictionary updating step, when input data related information and code generation information led from the input data are registered in the dictionary in association with each other, an element area is acquired from the free element control area and added to the dictionary in said element acquiring step, and when an element area is to be removed from the dictionary, the element area is returned and stored as an unused element area in the free element control area in said element returning step, thereby preparing for a next use.

4. The data compression method according to claim 1, further comprising the steps of:
   reserving a buffer for temporarily storing input data, said code generation information being indicative of position information in the buffer;
   searching a longest-match length by comparing the input data with previous input data, starting from a position designated by the position information in the buffer; and
   generating coded data based on the longest-match length and the position information in the buffer obtained in said longest-match searching step.

5. The data compression method according to claim 1, wherein the code generation information is a final output code.

6. The data compression method according to claim 1, wherein in said coded data generating step, coded data is generated by variable-length coding the code generation information.

7. The data compression method according to claim 6, wherein said variable-length coding is Huffman coding.

8. The data compression method according to claim 4, wherein in said longest-match searching step, the input data that has a longest match is registered in the dictionary.

9. The data compression method according to claim 1, wherein the input data related information is input data having a predetermined length.

10. A data compression method of reading input data from a predetermined input storage area, searching previous input data that matches the input data, generating coded data based on code generation information corresponding to the previous input data, and outputting the coded data to a predetermined output storage area, comprising the steps of:
    reserving a dictionary constructed with a first storage area and a second storage area, the first storage area storing representative data related to the input data and classification information in association with each other, while the second storage area storing auxiliary data related to the input data and code generation information in association with each other for each of the classification information; and
    searching the dictionary, said searching step including a first searching step and a second searching step,
    wherein in said first searching step, the first storage area is searched using the representative data as a key, and in said second searching step, the second storage area is searched using the auxiliary data as a key,
    representative data is led from the input data to search the first storage area in said first searching step, thereby obtaining the classification information related to the representative data,
    the second storage area, which is designated by the classification information, is searched using the auxiliary data led from the input data as a key in said second searching step, and code generation information related to the auxiliary data is obtained, and
    coded data is generated from the code generation information and outputted to an output storage area.

11. The data compression method according to claim 10, wherein in a case where the code generation information corresponding to the auxiliary data is not found in said second searching step, further comprising a dictionary registration step having the steps of:
    leading representative data, auxiliary data, and code generation information from the input data;
    storing the representative data in association with the classification information in the first storage area; and
    storing the auxiliary data in association with the code generation information in the second storage area, which is designated by the classification information.

12. The data compression method according to claim 11, wherein said second storage area is classified into a plurality of small areas by the classification information, each small area being empty or having one or more element areas, wherein the element area is constructed with auxiliary data, code generation information, and a pointer, and constitutes a data structure by being linked to another element area within a same small area by the pointer.

13. The data compression method according to claim 12, further comprising the steps of:
    reserving a free element control area including an unused element area;
    acquiring an element area;
    returning an element area; and
    updating the dictionary,
    wherein in said dictionary updating step, when representative data, auxiliary data and code generation information led from the input data are registered in the dictionary, an element area is acquired from the free element control area and added to the second storage area in said element acquiring step, and when an element area is to be removed from the second storage area, the element area is stored as an unused element area in the free element control area in said element returning step, thereby preparing for a next use.

14. The data compression method according to claim 10, further comprising the steps of:
    reserving a buffer for temporarily storing input data, said code generation information indicative of position information in the buffer;
    searching a longest-match length by comparing the input data with previous input data, starting from a position designated by the position information in the buffer; and
    generating coded data based on the longest-match length and the position information in the buffer obtained in said longest-match searching step.

15. The data compression method according to claim 10, wherein the code generation information is a final output code.

16. The data compression method according to claim 14, wherein in said coded data generating step, coded data is generated by variable-length coding the code generation information.

17. The data compression method according to claim 16, wherein said variable-length coding is Huffman coding.

18. The data compression method according to claim 14, wherein in said longest-match searching step, the input data that finds a longest match is registered in the dictionary.

19. The data compression method according to claim 10, further comprising the step of hash generation, wherein the representative data is a hash value obtained in said hash generation step based on the input data.

20. A computer program functioning as a data compression apparatus, which reads input data from a predetermined input storage area, searches previous input data that matches the input data, generates coded data based on code generation information corresponding to the previous input data, and outputs the coded data to a predetermined output storage area, by having a computer read and execute said program, said computer program comprising:

program codes for a step of reserving a dictionary for storing input data related information related to the previous input data, and code generation information of the input data in association with each other, said dictionary comprising an element area which includes link information for linking the element area to another element area;

program codes for a step of searching the dictionary reserved;

program codes for a step of registering input data related information related to the previous input data, and code generation information of the input data in the element area; and program codes for a step of tracking the element area according to the link information in said dictionary searching step to search input data related information in the dictionary, which corresponds to the input data related information related to current input data, then obtaining code generation information related to the input data related information, and generating coded data based on the code generation information.

21. A storage medium storing the computer program according to claim 20.

22. A computer program functioning as a data compression apparatus, which reads input data from a predetermined input storage area, searches previous input data that matches the input data, generates coded data based on code generation information corresponding to the previous input data, and outputs the coded data to a predetermined output storage area, by having a computer read and execute said program, said computer program comprising:

program codes for a step of reserving a dictionary constructed with a first storage area and a second storage area, the first storage area storing representative data related to the input data and classification information in association with each other, while the second storage area storing auxiliary data related to the input data and code generation information in association with each other for each of the classification information; and program codes for a step of searching the dictionary, said searching step including a first searching step and a second searching step, wherein in said first searching step, the first storage area is searched using the representative data as a key, and in said second searching step, the second storage area is searched using the auxiliary data as a key, representative data is led from the input data to search the first storage area in said first searching step, thereby obtaining the classification information related to the representative data, the second storage area, which is designated by the classification information, is searched using the auxiliary data led from the input data as a key in said second searching step, and code generation information related to the auxiliary data is obtained, and coded data is generated from the code generation information and outputted to an output storage area.

23. A storage medium storing the computer program according to claim 22.

24. A data compression apparatus for reading input data from a predetermined input storage area, searching previous input data that matches the input data, generating coded data based on code generation information corresponding to the previous input data, and outputting the coded data to a predetermined output storage area, comprising:

reserving means reserving a dictionary which stores input data related information related to the previous input data, and code generation information of the input data in association with each other, said dictionary comprising an element area which includes link information for linking the element area to another element area;

searching means for searching the dictionary reserved;

registering means for registering input data related information, related to the previous input data, and code generation information of the input data in the element area; and coded data generating means for tracking the element area according to the link information by said dictionary searching means to search input data related information in the dictionary, which corresponds to the input data related information related to current input data, then obtaining code generation information related to the input data related information, and generating coded data based on the code generation information.

25. A data compression apparatus for reading input data from a predetermined input storage area, searching previous input data that matches the input data, generating coded data based on code generation information corresponding to the previous input data, and outputting the coded data to a predetermined output storage area, comprising:

reserving means reserving a dictionary constructed with a first storage area and a second storage area, the first storage area storing representative data related to the input data and classification information in association with each other, while the second storage area storing auxiliary data related to the input data and code generation information in association with each other for each of the classification information; and searching means for searching the dictionary, said searching means including first searching means and second searching means, wherein said first searching means searches the first storage area using the representative data as a key, and said second searching means searches the second storage area using the auxiliary data as a key, representative data is led from the input data to search the first storage area by said first searching means, thereby obtaining the classification information related to the representative data, the second storage area, which is designated by the classification information, is searched by said second searching means using the auxiliary data led from the input data as a key, and code generation information related to the auxiliary data is obtained, and coded data is generated from the code generation information and outputted to an output storage area.

\* \* \* \* \*